United States Patent
Yang et al.

(10) Patent No.: US 7,091,542 B1
(45) Date of Patent: Aug. 15, 2006

(54) METHOD OF FORMING A MIM CAPACITOR FOR CU BEOL APPLICATION

(75) Inventors: Chih-Chao Yang, Poughkeepsie, NY (US); Timothy Dalton, Ridgefield, CT (US); Lawrence Clevenger, LaGrangeville, NY (US); Gerald Matusiewicz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/905,973

(22) Filed: Jan. 28, 2005

(51) Int. Cl.
*H01L 29/72* (2006.01)

(52) U.S. Cl. ............. 257/301; 257/303; 257/306; 257/310; 257/532; 257/E27.048; 257/E27.071

(58) Field of Classification Search .......... 257/301, 257/303, 306, 310, 532, E27.048, E27.071, 257/E27.092
See application file for complete search history.

(56) References Cited

U.S. PATENT DOCUMENTS

| | | | |
|---|---|---|---|
| 3,763,409 A * | 10/1973 | Sheard | 361/305 |
| 5,675,184 A | 10/1997 | Matsubayashi | |
| 5,879,985 A * | 3/1999 | Gambino et al. | 438/253 |
| 6,461,914 B1 | 10/2002 | Roberts | |
| 6,670,237 B1 | 12/2003 | Loh | |
| 6,764,915 B1 | 7/2004 | Lee | |
| 2001/0048352 A1* | 12/2001 | Klee et al. | 333/188 |
| 2003/0030088 A1* | 2/2003 | Kumagai et al. | 257/296 |
| 2003/0032234 A1* | 2/2003 | Suzuki | 438/239 |
| 2003/0137797 A1* | 7/2003 | Kimoto et al. | 361/321.2 |
| 2003/0139049 A1* | 7/2003 | Nakamura et al. | 438/692 |
| 2004/0130849 A1* | 7/2004 | Kurihara et al. | 361/311 |
| 2004/0161891 A1* | 8/2004 | Suzuki | 438/240 |
| 2004/0222493 A1* | 11/2004 | Sato et al. | 257/532 |
| 2005/0082586 A1* | 4/2005 | Tu et al. | 257/296 |
| 2005/0087838 A1* | 4/2005 | Hsin et al. | 257/532 |
| 2005/0118797 A1* | 6/2005 | Lee | 438/618 |
| 2005/0121744 A1* | 6/2005 | Chang et al. | 257/532 |
| 2005/0146838 A1* | 7/2005 | Shioga et al. | 361/306.3 |

* cited by examiner

*Primary Examiner*—Matthew Smith
*Assistant Examiner*—Joannie Adelle Garcia
(74) *Attorney, Agent, or Firm*—Connolly Bove Lodge & Hutz LLP; Robert M. Trepp

(57) ABSTRACT

The present invention relates generally to integrated circuits, and particularly, but not by way of limitation, metal-insulator-metal (MIM) capacitors formed within a trench located within a metallization layer and in particular to MIM capacitors for Cu BEOL semiconductor devices.

11 Claims, 11 Drawing Sheets

FIGURE 8
A
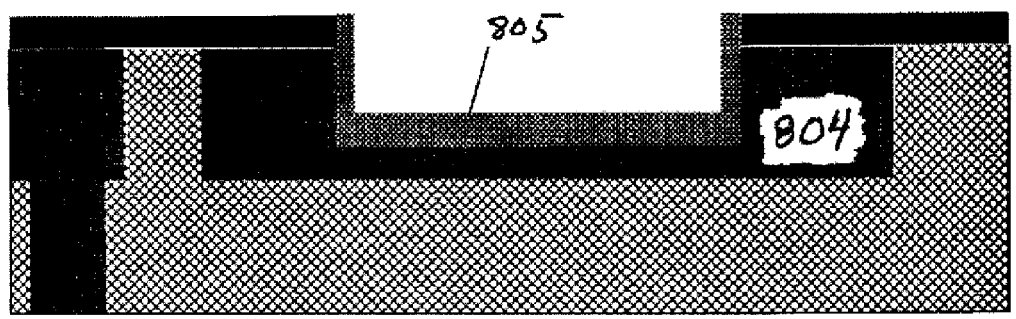
B
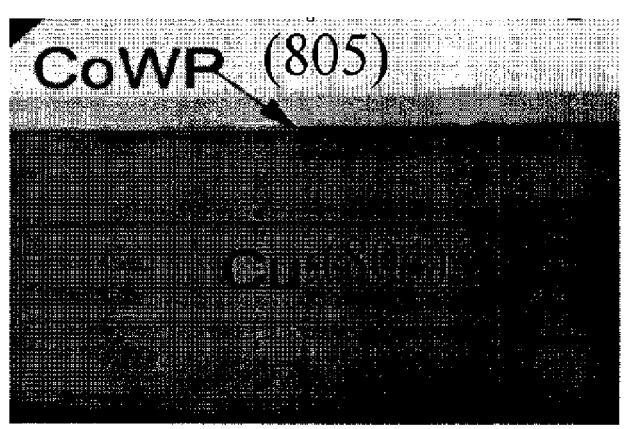

METHOD OF FORMING A MIM CAPACITOR FOR CU BEOL APPLICATION

FIELD OF THE INVENTION

The present invention relates generally to integrated circuits, and particularly, but not by way of limitation, metal-insulator-metal (MIM) capacitors formed within a trench located within a metallization layer and in particular to MIM capacitors for Cu BEOL semiconductor devices.

BACKGROUND

The information provided below is not admitted to be prior art to the present invention, but is provided solely to assist the understanding of the reader.

Metal-Insulator-Metal Capacitors (MIM Cap) have been integrated in various integrated circuits for applications of analog/logic, analog-to-digital, mixed signal, and radio frequency circuits. The method of fabricating MIM Cap in the current 90 nm technology is described with reference to FIGS. 1A–1G. As shown in FIG. 1A, $SiO_2$ (102) and $Si_3N_4$ (103) are deposited in series on a wafer surface with interconnects (101) embedded in an insulator layer 100. In FIG. 1B, the wafer is patterned with an alignment mask to create alignment marks at kerf area 120. In FIGS. 1C and 1D, a first conductive TiN plate (104), a dielectric layer (105), a second conductive TiN plate (106), and a passivation $Si_3N_4$ layer (107) are sequentially deposited, and then patterned by masking and etching to obtain a top-electrode (130) of a capacitor. Another $Si_3N_4$ layer is then deposited on the wafer, and then patterned by a third masking and etching to obtain a bottom-electrode (150) and insulator (140) of the capacitor as shown in FIGS. 1E and 1F. In FIG. 1G, another insular layer 109 is deposited on the wafer, and then patterned to form electrical contacts 160 and 170.

The above process of record for integrating MIM Cap into back-end-of-line (BEOL) requires three extra masking and etching steps to form the capacitors, which may increase overall fabrication costs. Also, the capacitor-dielectric damage layer, as shown in FIG. 2, resulting from top-electrode over-etch and the poor adhesion between SiN/Cu and SiN/TiN interfaces can cause reliability concerns. Moreover, the capacitor-dielectric thickness is required to be thicker than 500A in order to ensure sufficient process window during top-electrode etch. This requirement limits the extendibility of the process to next technology generations. Furthermore, the high resistivity electrode material, TiN, limits Q factor of the MIM Cap.

A method of manufacturing a capacitor with a compatible copper process is disclosed in U.S. Pat. No. 6,461,914, FIG. 3. However, extra masking and etching steps are required to form the capacitors. Moreover, the capacitor-dielectric layer existing in non-capacitor area will increase the overall structure capacitance, which can increase the interconnect RC delay. Furthermore, the high resistivity electrode material, TaN, limits Q factor of the MIM Cap.

Consequently, products containing MIM capacitors formed by conventional methods are economically uncompetitive in view of their high costs and poor performance. Therefore, a need exists for lower-cost MIM capacitors, formed by methods that result in less damage.

Other objects and advantages will become apparent from the following disclosure.

SUMMARY OF THE INVENTION

The present invention provides a structure and corresponding methods for MIM capacitors in semiconductor devices. An aspect of the present invention provides a metal-insulator-metal (MIM) capacitor for a Cu BEOL semiconductor device comprising a bottom capacitor plate having a trench defined therein; a top capacitor plate disposed within said trench; a capacitor dielectric disposed between said capacitor plates within said trench; a first electrode electrically connected to said bottom plate; and a second electrode electrically connected to said top plate.

According to a preferred aspect, the inventive MIM capacitor further comprises a Cu diffusion barrier formed on said bottom plate and disposed between said bottom plate and said dielectric. According to a more preferred aspect, the Cu diffusion barrier is formed of COWP.

According to an aspect the bottom capacitor plate is a metal selected from the group consisting of copper, aluminum, or other electrical conductive materials. Acording to a preferred aspect, the bottom capacitor plate is copper.

According to an aspect the inventive MIM capacitor comprises a capacitor dielectric disposed between two regions of metallization. According to an aspect, the capacitor dielectric is selected from the group consisting of oxide-nitride-oxide, $SiO_2$, $TaO_5$, $PSiN_x$ $Si_3N_4$, SiON, SiC, $TaO_2$, $ZrO_2$, $HfO_2$, $Al_2O_3$, and combination thereof. According to a preferred aspect, the capacitor dielectric preferably comprises high-k materials, eg. $TaO_5$, $TaO_2$, $ZrO_2$, $HfO_2$.

According to an aspect the top plate of the inventive MIM capacitor is a metal selected from the group consisting of copper, Ta, TaN, Ti, TiN, TiSiN, W, Ru, Al, alloys thereof, and mixtures thereof. According to a preferred aspect, the top capacitor plate preferably comprises copper.

According to an aspect the first and second electrodes of the inventive MIM capacitor are formed from a metal selected from the group consisting of copper, Al, AlCu, Ti, TiN, Ta, TaN, W, WN, MoN, Pt, Pd, Os, Ru, IrO2, ReO2, ReO3, alloys thereof and mixtures thereof. According to a preferred aspect, the first and second electrodes are formed of the same metal. According to a more preferred aspect, the electrodes are formed from copper.

According to an aspect the present invention provides a method of fabricating a MIM capacitor for a Cu BEOL semiconductor device. According to an aspect the method comprises providing a semiconductor wafer; providing a first dielectric layer on said wafer; forming a first metallization in said dielectric, wherein an upper surface of said first metallization and an upper surface of said first dielectric form a substantially coplanar surface; forming a dielectric film on said coplanar surface; masking and etching a trench through said film into said first metallization; forming an intermetal dielectric layer over said first metallization in said trench; forming a second metalization over said intermetal dielectric in said trench wherein an upper surface of said second metallization and an upper surface of said first dielectric form a substantially coplanar surface; forming a layer of a second dielectric on said coplanar surface; forming a first electrode in said second dielectric in electrical contact with said first metallization; and forming a second electrode in said second dielectric in electrical contact with said second metallization.

According to a preferred aspect, the inventive method of fabricating an MIM capacitor further comprises forming a Cu diffusion barrier on said first metallization and disposed between said first metallization and said intermetal dielectric. According to a more preferred aspect, the Cu diffusion barrier is formed of COWP.

According to an aspect, the present invention provides an MIM capacitor fabricated according to the inventive method.

Still other aspects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 8A is a schematic illustrating a process step of the present invention;

FIG. 8B is a micrograph illustrating the result of the process step of FIG. 8A;

It is to be noted, however, that the appended drawings illustrate only typical embodiments of this invention and are therefore not to be considered limiting of its scope, for the invention may admit to other equally effective embodiments.

DETAILED DESCRIPTION OF PREFERRED EMBODIMENT

Reference is made to the figures to illustrate selected embodiments and preferred modes of carrying out the invention. It is to be understood that the invention is not hereby limited to those aspects depicted in the figures. It is understood that similar numerals in the various figures refer to equivalent features.

Figure 5:
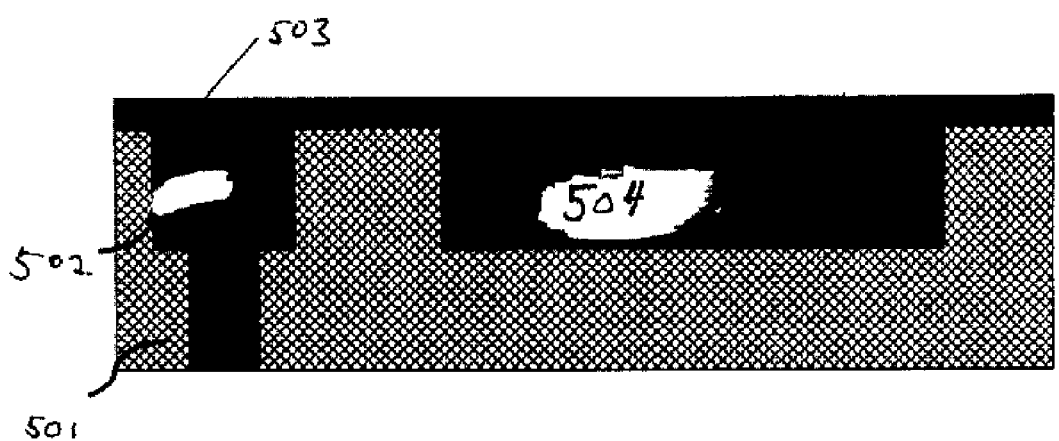
FIG. 5 is a schematic illustrating a process step of the present invention.

With reference to FIG. 5, fabrication of the inventive MIM capacitor starts from a wafer having an insulator layer 501 deposited thereon. The wafer further includes metallic circuit elements 502 and 504 formed within layer 501. Preferably, circuit elements 502 and 504 are copper and preferably circuit elements 502 and 504 were formed using conventional damascene and dual damascene techniques. It is preferred that the upper surface of circuit element 504 be flush with and coplanar to the surface of insulator layer 501. The upper, exposed surface, defined by the wafer and any feature built thereon, may be known as the wafer surface. A dielectric film 503 is then deposited on the wafer surface. Film 503 is advantageously chosen from $Si_3N_4$, SiC, $SiO_2$. However, the film is not limited to the listed materials, but may be chosen from any suitable insulator. Film 503 may be applied by any suitable method known to the art.

Figure 6:
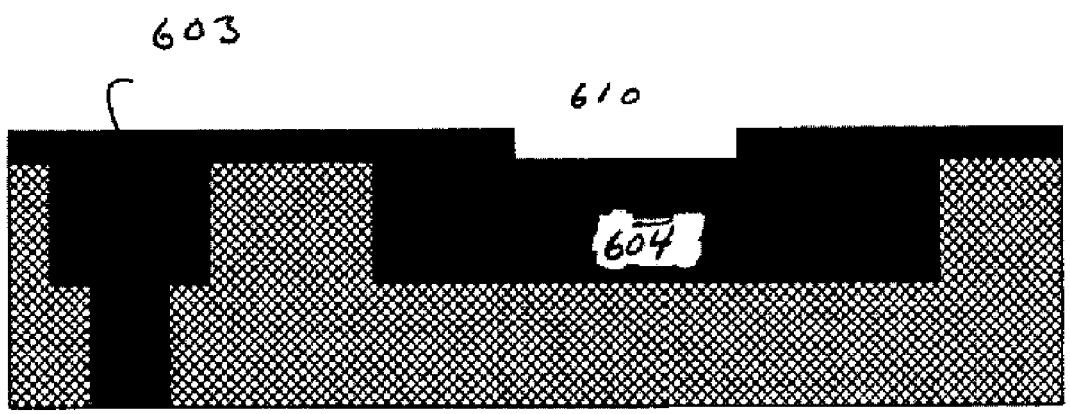
FIG. 6 is a schematic illustrating a process step of the present invention.

Referring to FIG. 6, the dielectric film 603 is patterned by masking and etching to define an area 610 in which to locate the MIM capacitor. Etching film 603 exposes Cu interconnect 604 to form the bottom-electrode of the capacitor. The bottom electrode may be termed the first metallization.

Figure 1:
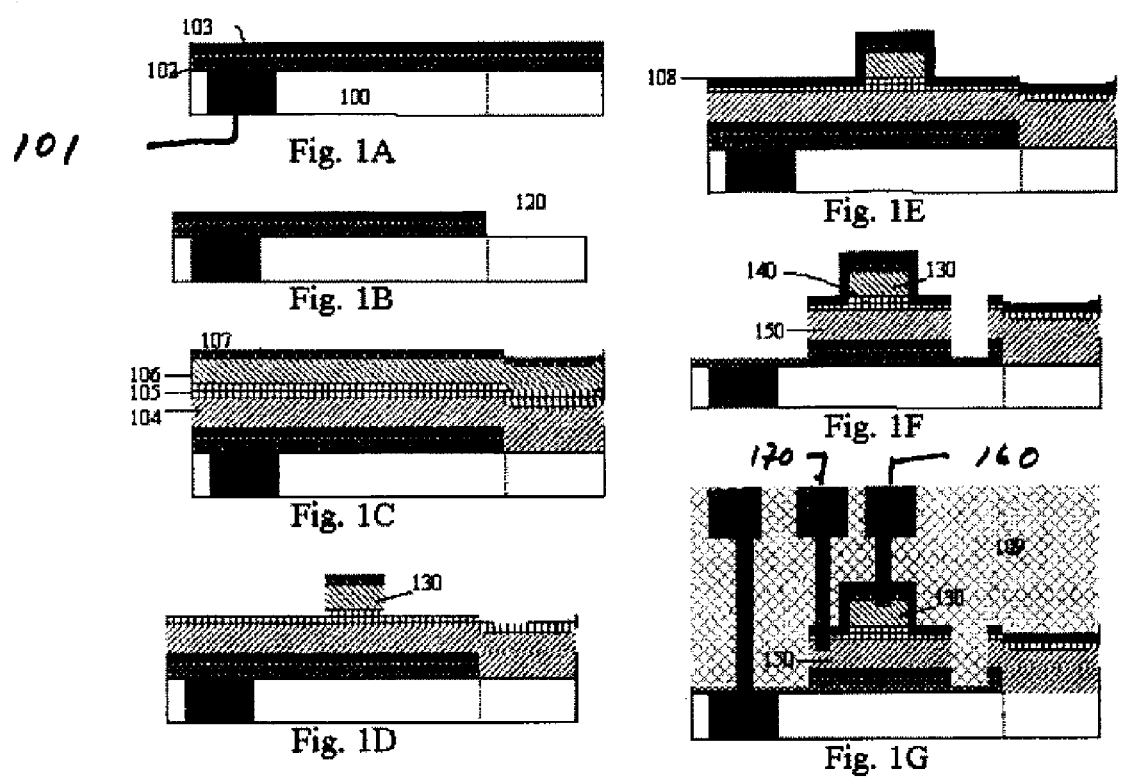
FIG. 1 is a schematic of a conventional MIM capacitor fabrication method.
Figure 2:
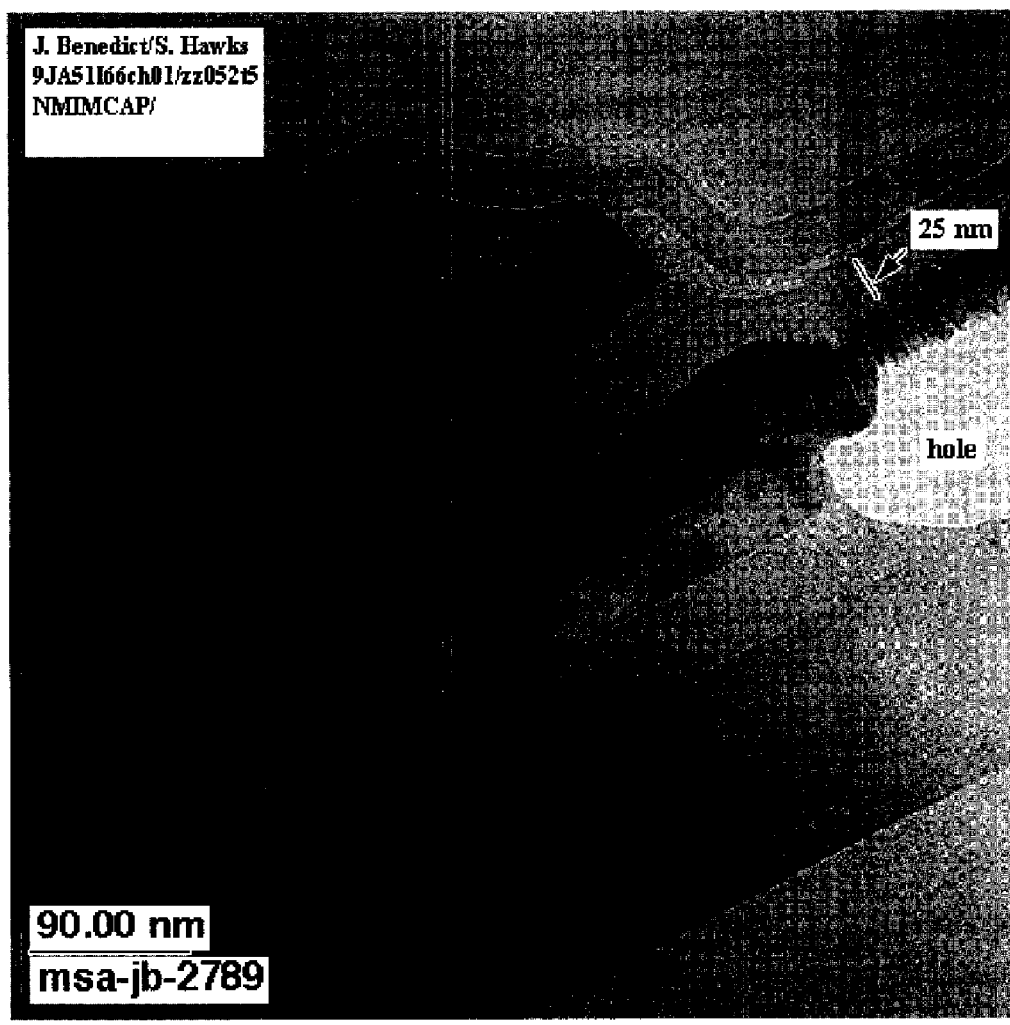
FIG. 2 is a micrograph illustrating damage to a MIM capacitor fabricated by conventional methods.
Figure 3:
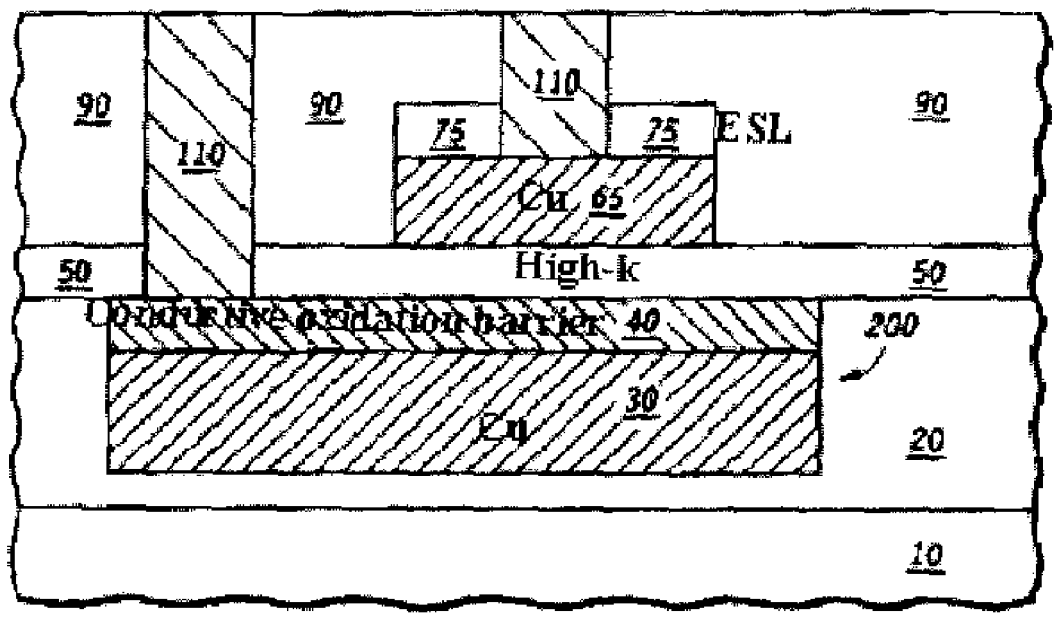
FIG. 3 is a schematic of a conventional MIM capacitor disclosed in U.S. Pat. No. 6,461,914.
Figure 4:
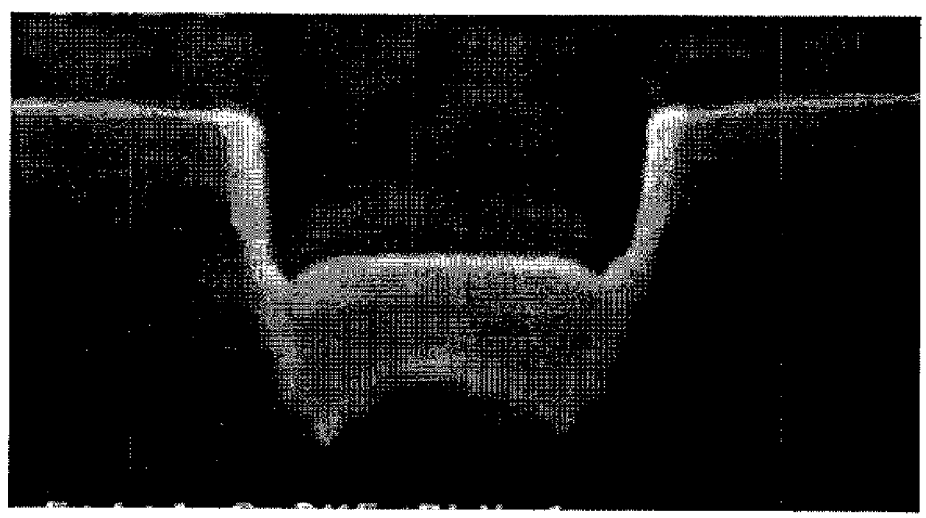
FIG. 4 is a micrograph illustrating the results of the process step of FIG. 7.
Figure 7:
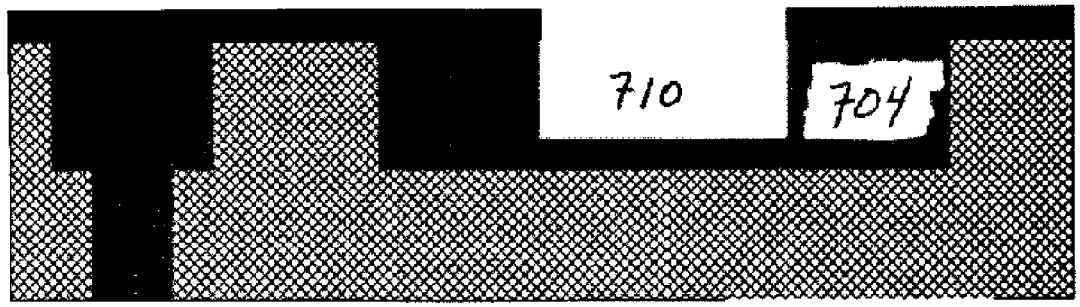
FIG. 7A is a schematic illustrating a process step of the present invention.

Referring to FIG. 7, a trench 710 is formed by etching portions of metal 704. Etching is advantageously performed by wet etch processes known to the art using acids such as, but not limited to $HNO_3$, HCl, $H_2SO_4$, HF, and combinations thereof. FIG. 4 is a micrograph illustrating the method through the process of FIG. 7.

FIG. 8 relates to preferred embodiments wherein the exposed surface of the copper conductor 804 is selectively capped with a layer 805 of COWP which serves both as a passivation and Cu diffusion barrier layer. Preferably, the COWP layer thickness is between 50 and 300 Å. The passivation and copper diffusion barrier functions may be serve by materials such as CoSnP, Pd, Ru. The passivation layer may be applied by any technique standard to the art.

Figure 9:
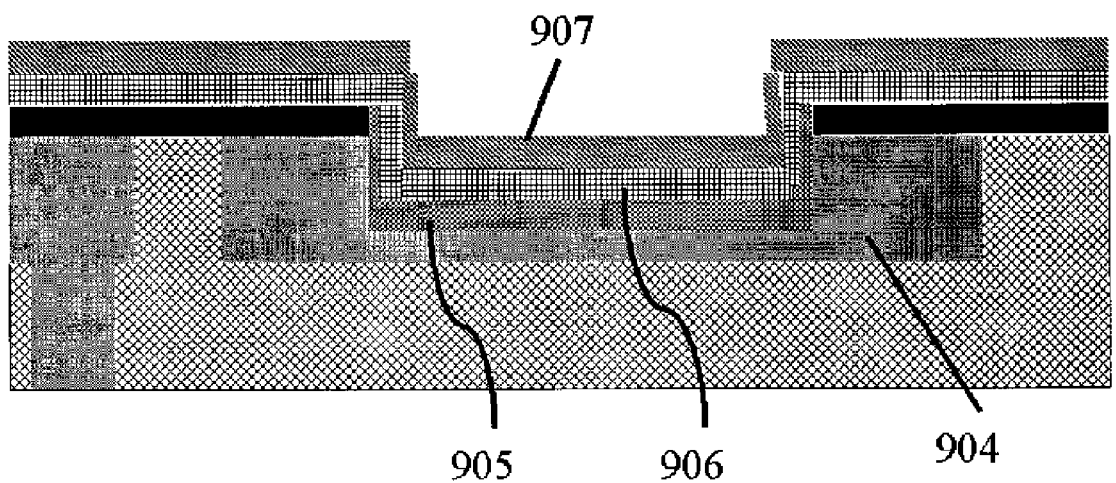
FIG. 9 is a schematic illustrating a process step of the present invention.

Referring to FIG. 9, a layer of a capacitor dielectric 906 is applied over conductor 904 or the optional passivation layer 905. The capacitor dielectric may be termed an intermetal dielectric. The capacitor dielectric may advantageously be chosen from any suitable insulator including, but not limited to oxide-nitride-oxide, $SiO_2$, $TaO_5$, $PSiN_x$, $Si_3N_4$, SiON, SiC, $TaO_2$, $ZrO_2$, $HfO_2$, $Al_2O_3$, and mixtures thereof. The capacitor dielectric may be applied by any suitable technique known to the art. Preferably, the capacitor dielectric layer thickness is between 50 and 10,00 Å.

Following application of the capacitor dielectric, the various dielectric surfaces may be coated with a thin layer of a conductive seed material, such as, but not limited to Cu and Ru. The application may be performed by standard techniques, including, but not limited to, PVD, CVD, or ALD deposition technologies. The optional seed layer is not indicated in the figure.

A conductive layer 907 of a metal or alloy such as, but not limited to Ta, TaN, Ti, TiN, TiSiN, W, Ru, Cu, Al, and mixtures thereof is deposited on top of the wafer. The deposition methods may be, but is not limited to, PVD, CVD, electroplating, electroless plating, and spin-on processes. Preferably, the thickness of the conductive layer is between 200 and 10,0000 Å. Layer 907 may be termed the top capacitor plate or the second metallization.

Figure 10:
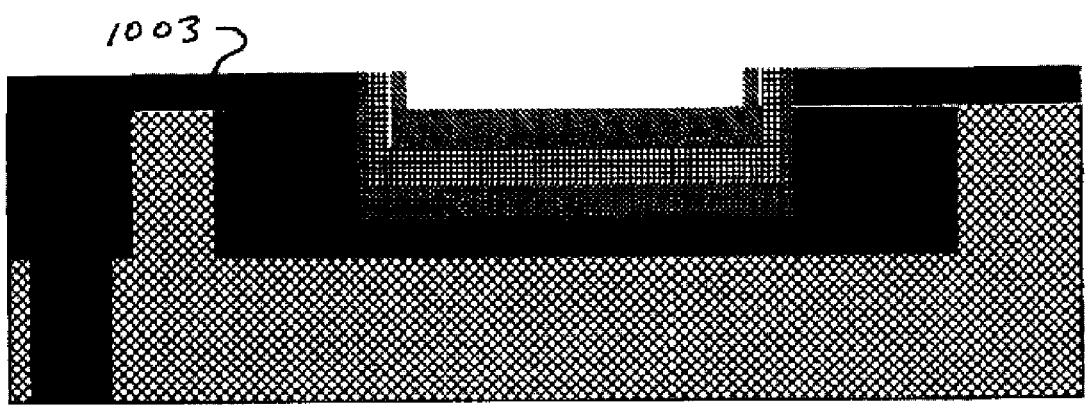
FIG. 10 is a schematic illustrating a process step of the present invention.

Referring to FIG. 10, the capacitor is planarized by an appropriate process, such as CMP stopping on film 1003.

Figure 11:
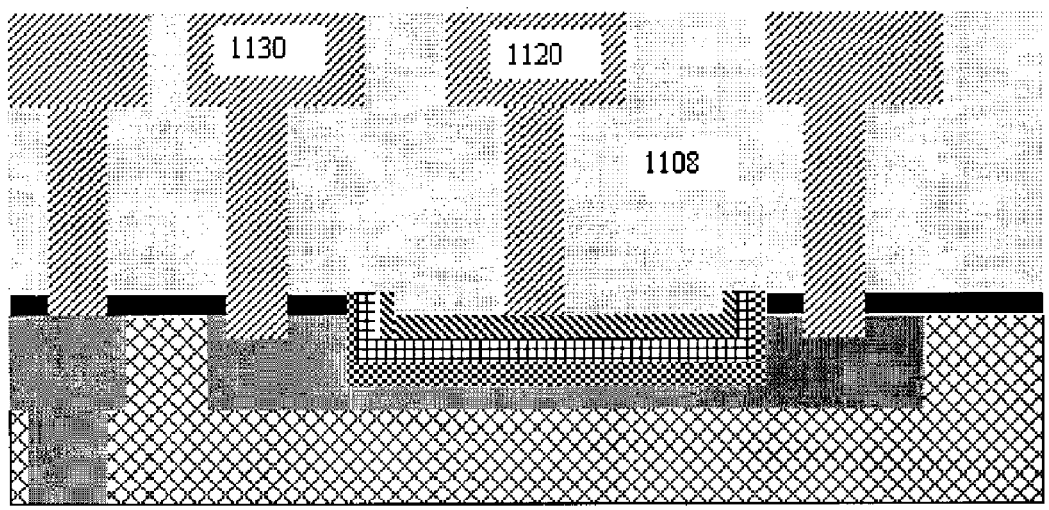
FIG. 11 is a schematic illustrating the inventive MIM capacitor following the final process step of the inventive method.

The process is completed in FIG. 11. An insulation layer 1108 is deposited on the wafer. Preferably, the dielectric layer is composed of oxide and has preferably a thickness between 500 and 10,0000 Å. Layer 1108 is masked, etched and filled with an electrode material to form electrical contacts 1120 to the top capacitor plate and 1130 to the bottom capacitor plate. Electrical contacts 1120 and 1130 are preferably copper, but may be any suitable conductor including, but not limited to Cu, Al, AlCu, Ti, TiN, Ta, TaN, W, WN, MoN, Pt, Pd, Os, Ru, IrO2, ReO2, ReO$_3$, alloys thereof, and mixtures thereof.

It will, therefore, be appreciated by those skilled in the art having the benefit of this disclosure that this invention is capable of producing a MIM capacitor for Cu BEOL application. Although the illustrative embodiments of the invention are drawn from the semiconductor arts, the invention is not intrinsically limited to that art. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense. Moreover, it is intended that the appended claims be construed to include alternative embodiments.

INCORPORATION BY REFERENCE

All publications, patents, and pre-grant patent application publications cited in this specification are herein incorporated by reference, and for any and all purposes, as if each individual publication or patent application were specifically and individually indicated to be incorporated by reference. In the case of inconsistencies the present disclosure will prevail.

What is claimed as new and desired to be protected by Letters Patent of the United States is:

1. A metal-insulator-metal (MIM) capacitor for a Cu BEOL semiconductor device comprising:
    a bottom capacitor plate having a trench defined therein;
    a top capacitor plate disposed within said trench;
    a capacitor dielectric disposed between said capacitor plates within said trench;
    a Cu diffusion barrier formed on said bottom plate and disposed between said bottom plate and said dielectric;
    a first electrode electrically connected to said bottom plate; and
    a second electrode electrically connected to said top plate.

2. The MIM capacitor, according to claim 1, wherein said Cu diffusion barrier comprises a conductive material.

3. The MIN capacitor, according to claim 2, wherein said conductive material is a metal selected from the group consisting of CoWP, CoSnP, Pd, Ru, alloys thereof, and mixtures thereof.

4. The MIM capacitor, according to claim 1, further comprising a conductive seed layer interposed between said capacitor dielectric and said top plate.

5. The MIM capacitor, according to claim 4, wherein said conductive seed layer comprises a metal selected from the group consisting of Cu, Ru, alloys thereof and mixtures thereof.

6. The MIM capacitor, according to claim 1, wherein said bottom plate is an electrically conductive material.

7. The MIM capacitor, according to claim 6, wherein said electrically conductive material is a metal selected from the group consisting of copper, aluminum, Al(Cu) alloys, W, Ru, alloys thereof, and mixtures thereof.

8. The MIM capacitor, according to claim 7, wherein said bottom plate is copper.

9. The MIM capacitor, according to claim 1, wherein said capacitor dielectric is selected from the group consisting of oxide-nitride-oxide, SiO$_1$, TaO$_5$, PSiN$_x$ Si$_3$N$_4$, SiON, SiC, TaO$_2$, ZrO$_2$, HfO$_2$, Al$_2$O$_3$, and combination thereof.

10. The MIM capacitor, according to claim 1, wherein said top plate is a metal selected from the group consisting of copper, Ta, TaN, Ti, TiN, TiSiN, W, Ru, Al, alloys thereof, and mixtures thereof.

11. The MIM capacitor, according to claim 1, wherein said first and second electrodes are formed from a metal selected from the group consisting of copper, Al, AlCu, Ti, TiN, Ta, TaN, W, WN, MoN, Pt, Pd, Os, Ru, IrO2, ReO2, ReO3, alloys thereof and mixtures thereof.

* * * * *